United States Patent [19]

Im

[11] Patent Number: 5,878,058

[45] Date of Patent: Mar. 2, 1999

[54] APPARATUS FOR DETERMINING AN ERROR LOCATOR POLYNOMIAL FOR USE IN A REED-SOLOMON DECODER

[75] Inventor: Yong-Hee Im, Seoul, Rep. of Korea

[73] Assignee: Daewoo Electronics Co., Ltd., Seoul, Rep. of Korea

[21] Appl. No.: 855,685

[22] Filed: May 14, 1997

[30] Foreign Application Priority Data

May 14, 1996 [KR] Rep. of Korea ............... 1996-16009

[51] Int. Cl.⁶ .................................................. H03M 13/00
[52] U.S. Cl. .................................... 371/37.11; 371/37.12; 371/37.1; 371/2.1
[58] Field of Search .................... 371/37.11, 37.12, 371/37.1, 2.1; 375/220, 350

[56] References Cited

U.S. PATENT DOCUMENTS

| 5,751,732 | 5/1998 | Im | 371/37.11 |
| 5,787,100 | 7/1998 | Im | 371/37.11 |
| 5,805,617 | 9/1998 | Im | 371/37.12 |

FOREIGN PATENT DOCUMENTS

0416513 A2  3/1991  European Pat. Off. .

*Primary Examiner*—Reba I. Elmore
*Assistant Examiner*—McDieunel Marc
*Attorney, Agent, or Firm*—Anderson, Kill & Olick, P.C.

[57] ABSTRACT

An apparatus, for use in a Reed-Solomon decoder, for calculating an error locator polynomial σ(X) by using Recursive Berlekamp Algorithm, wherein σ(X) is a (t)th order polynomial, t being a predetermined positive integer, the apparatus including: a variable generator for providing a control signal CASE3_FLAG and a late discrepancy; an inverse look up table for providing an inverse of the late discrepancy("inverse late discrepancy"); a discrepancy calculation block for providing a discrepancy and a control signal D_ZERO, delaying the updated error locator polynomial; a first GF multiplier for multiplying the discrepancy by the inverse late discrepancy; a selection block for selectively providing "0" or the updated error locator polynomial or a feedback value; a first shift register block for shifting an output from the selection block; a second GF multiplier for multiplying an output from the first GF multiplier by an output from the first shift register block; a first GF adder for adding an output from the second GF multiplier to the updated error locator polynomial; and, a first signal generator for generating control signals.

8 Claims, 4 Drawing Sheets

APPARATUS FOR DETERMINING AN ERROR LOCATOR POLYNOMIAL FOR USE IN A REED-SOLOMON DECODER

FIELD OF THE INVENTION

The present invention relates to an apparatus for correcting errors present in stored or transmitted data; and, more particularly, to an apparatus for determining coefficients of an error locator polynomial which are used in correcting errors in the data encoded by using a Reed-Solomon code.

DESCRIPTION OF THE PRIOR ART

Noises occurring in a process of transmitting, storing or retrieving data can in turn cause errors in the transmitted, stored or retrieved data. Accordingly, various encoding techniques having the capability of rectifying such errors have been developed.

In such encoding techniques, a set of check bits is appended to a group of message or information bits to form a codeword. The check bits, which are determined by an encoder, are used to detect and correct the errors. In this regard, the encoder essentially treats the bits comprising the message bits as coefficients of a binary message polynomial and derives the check bits by multiplying the message polynomial i(X) by a code generating polynomial g(X) or dividing i(X) by g(X), to thereby provide a codeword polynomial c(X). The code generating polynomial g(X) is selected to impart desired properties to a codeword so that the codeword will belong to a particular class of error-correcting binary group codes (see, e.g., S. Lin et al., "Error Control Coding: Fundamentals and Applications", Prentice-Hall, 1983).

One class of error correcting codes is the well-known BCH (Bose-Chaudhuri-Hocquenghen) code class, which includes the Reed-Solomon("RS") code. The mathematical basis of the RS code is explained in, e.g., the aforementioned reference by Lin et al. and also in U.S Pat. No. 4,162,480 issued to Berlekamp.

If roots of the code generating polynomial g(X) of the RS code are 2t consecutive powers of α as in Eq. (1), as many as t errors can be corrected, t being a positive integer:

$$g(X) = \prod_{i=1}^{2t} (X - \alpha^i) \qquad \text{Eq. (1)}$$

wherein α is a primitive element in a finite field $GF(2^m)$.

In the process of receiving or retrieving a transmitted or stored codeword, certain attendant noises are converted to an error pattern in the codeword. In order to deal with the error pattern imposed upon the RS code, a four step procedure is generally utilized. In discussing the error-correcting procedure, reference shall be made to an RS code consisting of codewords containing an N number of M-bit symbols (of which K symbols are informational symbols and (N–K) symbols are check symbols, N and K being a positive integer). In that case, c(X) becomes an (N–1)st order polynomial and 2t equals (N–K). As a first error correcting step, syndromes $S_0, S_1, \ldots, S_{2t-1}$ are calculated from a received codeword polynomial r(X), i.e., an (N–1)st order polynomial representing the received codeword. The received codeword polynomial r(X) is represented as $r_{N-1}X^{N-1} + r_{N-2}X^{N-2} + \ldots + r_1X^1 + r_0$, wherein $r_j$ is an (N–j)th symbol of a codeword, j ranging 1 to N. As a second step, using the syndromes, coefficients of an error locator polynomial σ(X) are calculated. In a third step, the error locator polynomial σ(X) is solved to obtain its roots, which represent the error locations in the received codewords. Specifically, if substituting a power of the primary element, $\alpha^{-j}$, for a variable X in the error locator polynomial σ(X) results in 0 (i.e., $\alpha^{-j}$ becomes a root of σ(X)), it means that an error has occurred in $r_j$, i.e., a (N–j)th symbol of a codeword.

As a fourth step, error values are calculated by using the error locations and the syndromes. Mathematical expressions for the syndromes and the coefficients of the error locator polynomial are set forth in the afore-referenced U.S. Pat. No. 4,162,480 issued to Berlekamp.

The fourth step will be now explained in more detail.

First, an error evaluator polynomial Ω(X) may be obtained as follows:

$$\Omega(X) = \theta(X)S(X) \qquad \text{Eq. (2)}$$

wherein σ(X) is the error locator polynomial and S(X) is a syndrome polynomial whose coefficients are the syndromes.

After deriving the error evaluation polynomial Ω(X), an error value $e_j$ may be calculated as follows:

$$e_j = \alpha^j \frac{\Omega(\alpha^{-j})}{\sigma'(\alpha^{-j})} \qquad \text{Eq. (3)}$$

wherein θ'(X) is the first derivative of the error locator polynomial σ(X); $\alpha^{-j}$ is the root of the error locator polynomial obtained in the third step; and the error value $e_j$ corresponds to the (N–j)th symbol which has been determined as being an error containing symbol in the third step.

After finding the error values, the original codeword can be recovered by adding the error values to the corresponding symbols as follows:

$$\begin{aligned} c'(X) &= r(X) + e(X) \qquad \text{Eq. (4)} \\ &= (c(X) + e(X)) + e(X) \\ &= c(X) + (e(X) + e(X)) \\ &= c(X) \quad (\because e(X) + e(X) = 0) \end{aligned}$$

wherein c'(X) is an error corrected codeword polynomial.

In order to illustrate the operation of an error locator polynomial calculating apparatus, for use in Reed-Solomon ("RS") decoder, Recursive Berlekamp Algorithm("RBA") is introduced as follows.

The RBA is an algorithm for calculating an error locator polynomial σ(X). Since an RS code which is capable of correcting t errors has t roots, the order of the error locator polynomial σ(X) is t, as shown in following (5).

$$\begin{aligned} \sigma(X) &= (1 + \alpha^{i_1}X)(1 + \alpha^{i_2}X) \ldots (1 + \alpha^{i_t}X) \qquad \text{Eq. (5)} \\ &= \sigma_t X^t + \sigma_{t-1}X^{t-1} + \ldots + \sigma_1 X^1 + \sigma_0 \end{aligned}$$

The error locator polynomial σ(X) is calculated by using the RBA by performing 4 steps as follows:

1. Initialization $\sigma_0(X)=1$, $B_0(X)=1$, $k_0=0$, $L_0=0$, $b_0=1$

That is to initialize the initial value of the error locator polynomial $\sigma_0(X)$ to be "1", the initial value of an intermediate value $B_0(X)$ to be "1", the initial value of an actual order of the error locator polynomial $L_0$ to be "0", the initial value of an order of the X, $k_0$ to be "0", and the initial value of a late discrepancy $b_0$ to be "1".

Since the order of the error locator polynomial σ(X) is t, t+1 registers are needed to store coefficients of the error locator polynomial including a constant term "1". The order of the actual error locator polynomial LN is increased by 1 only when it is necessary. $B_N(X)$, $k_N$, and $b_N$ are used in order to update the error locator polynomial σ(X).

2. Calculation of a discrepancy

The initial value of the discrepancy is equal to a syndrome $S_0$, and other discrepancies are calculated by using (6) as follows:

$$D_N = S_N + \sum_{i=1}^{L} \sigma_i S_{N-i} \quad (N \geq 1) \qquad \text{Eq. (6)}$$

In (6), $D_N$ is the discrepancy, $\sigma_i$ is a coefficient of $\sigma(X)$, $S_N$ and $S_{N-i}$ are syndromes, and the N is the number of iterations, ranging from 0 to 15.

3. Updating of the discrepancy

The discrepancy is updated as follows:

case 1. $D_N = 0$:

$k_{N+1} = k_N + 1$ case 2. $D_N \neq 0$, $2L_N \leq N$:

$\sigma_{N+1}(X) = \sigma_N(X) - D_N \cdot b_N^{-1} \cdot X^k \cdot B_N(X)$ $L_{N+1} = N + 1 - L_N$ $k_{N+1} + 1$ $B_{N+1}(X) = \sigma_N(X)$ $b_{N+1} = D_N$ case 3. $D_N \neq 0$, $2L_N > N$ $\sigma_{N+1}(X) = \sigma_N(X) - D_N \cdot b_N^{-1} \cdot (X)^k \cdot B_N(X)$ $k_{N+1} = k_N + 1$ 4. Execution of step 2

Step 2 is executed until N becomes 2t-1.

Figure 1:
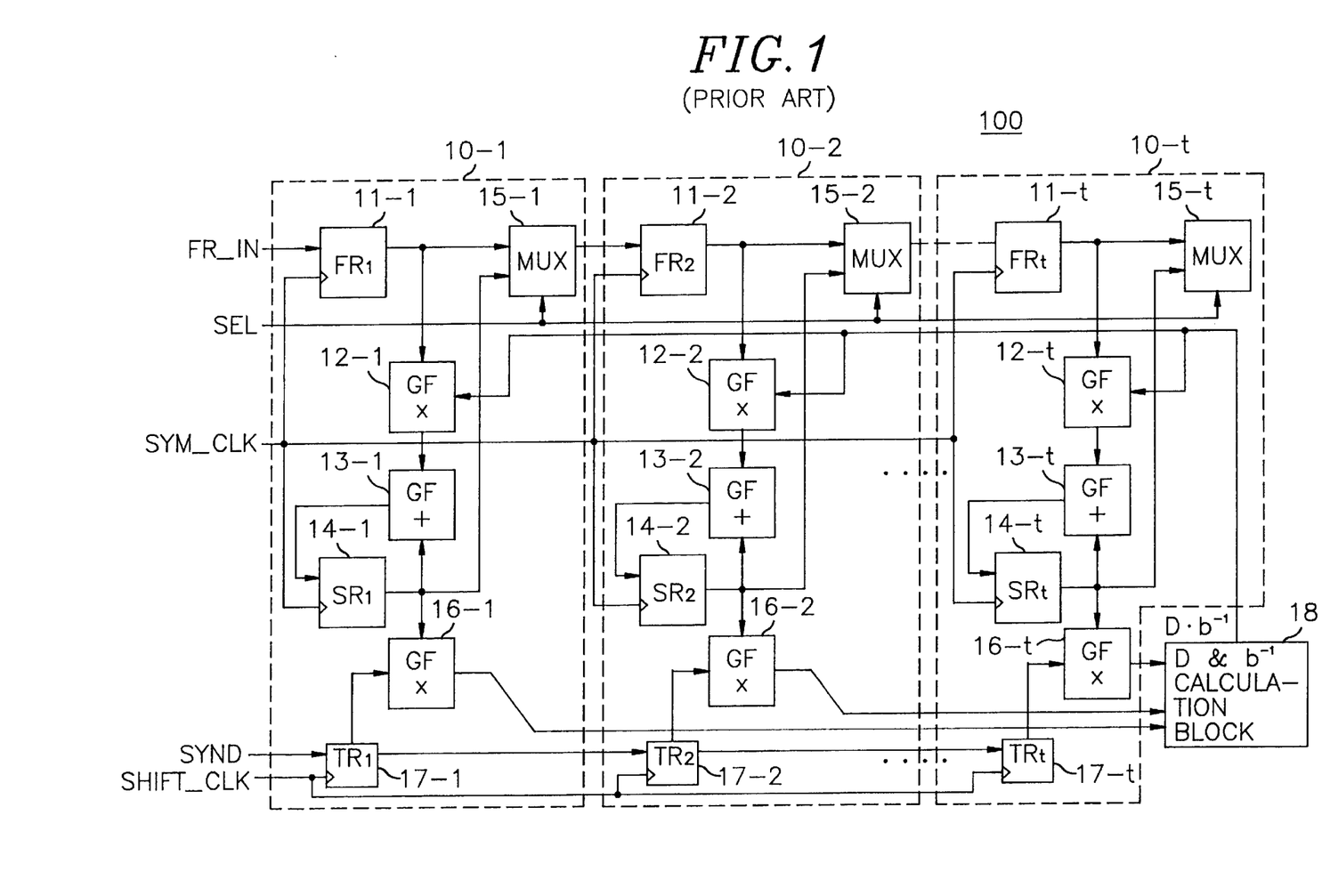
FIG. 1 shows a block diagram of a conventional error locator polynomial calculating apparatus.

Referring to FIG. 1, there is shown a block diagram of a conventional error locator polynomial calculation apparatus 100 which determines the coefficients of the error locator polynomial $\sigma(X)$.

The apparatus 100 includes t calculation cells 10-1 to 10-t and a discrepancy and an inverse late discrepancy("D&b$^{-1}$") calculation block 18, whrerin a late discrepancy is a delayed discrepancy and the inverse late discrepancy is an inverse of the late discrepancy. Each calculation cell 10-i(i ranging 1 to t) contains 3 registers, that is, a first register("FRi") 11-i, a second register("SRi") 14-i, a third register("TRi") 17-i, 2 Galois Field("GF")multipliers 12-i, 16-i, a GF adder 13-i, a multiplexer("MUX") 15-i.

In the first calculation cell 10-1, the input of the FR1 FR_IN is provided from a control block(not shown) which outputs a "0" or "1" to the FR1 11-1, depending on the value of the discrepancy D and the number of iterations N. Also in the first calculation cell 10-1, the TR1 is connected to an external shift register(not shown) which stores the syndromes $S_j$'s, j ranging 0 to 2t-1.

At the rising edge of a register shift clock SHIFT_CLK, a new syndrome symbol enters the external shift register starting from $S_0$. At the same time, the contents of the TRi are right-shifted one symbol position to TR(i+1) and the contents of the external shift register are shifted into the TR1 in the first calculation cell 10-1.

The contents of SRi and the TRi are multiplied cell-by-cell and the multiplication results are summed at the D&b$^{-1}$ calculation block 18 to yield D. D is then multiplied by b$^{-1}$ at the D&b$^{-1}$ calculation block 18, wherein b is a late discrepancy which delays D and b$^{-1}$ is an inverse of b.

The result D·b$^{-1}$ is then multiplied by the contents of the FRi and the results are added to the contents of SRi and then fed back to the SRi. At the rising edge of a symbol clock SYM_CLK, new contents are loaded into the FRi and the SRi and, at the same time, the SHIFT_CLK also goes true to load in new syndrome.

If $D_N = 0$, then D·b$^{-1}$ =0 too. Hence the content of SRi is not changed at the rising edge of the SYM_CLK. The MUX 15-i's are set to select outputs from the FRi's, in response to a selection signal SEL. Hence at the rising edge of the SYM_CLK, the FRi's are right-shifted by one symbol position with "0" entering the first stage in the first calculation cell 10-1.

If $D_N \neq 0$ and $N \geq 2L$, then the results from the GF adders 13-i's are loaded into the SRi's at the rising edge of the SYM_CLK. The MUX 15-i's are set to select outputs from the SRi's, in response to the SEL. Hence at the rising edge of the SYM_CLK, the contents of the SRi's, which are right-shifted by one symbol position, are loaded into the FRi's and, at the same time, "1" is loaded into the FR1.

If $D_N \neq 0$ and N<2L, then the results from the GF adders 13-i are loaded into the SRi's at the rising edge of the SYM_CLK. New contents of the FRi's are determined in the same way as that given for the $D_N = 0$ case.

The D&b$^{-1}$ calculation block 18 sums all outputs from each of the second GF multiplier 16-i to thereby generate the discrepancy D. In addition, the D&b$^{-1}$ calculation block 18 delays D to thereby generate the late discrepancy b, and calculates the inverse late discrepancy b$^{-1}$. Then, the D&b$^{-1}$ calculation block 18 multiplies D by b$^{-1}$ and provides the result to the first GF multiplier 12-i.

The operation is repeated in the same way until the N becomes 2t-1. After the operation ends, the contents of the SRi's become the coefficients of the error locator polynomial $\sigma(X)$.

In accordance with the conventional error locator polynomial calculating apparatus 100 explained above, as many as two GF multipliers and a GF adder per each of the calculation cells 10-1 to 10-t are needed. These facts render the structure of the apparatus highly complicated and, which may, in turn, makes it rather difficult to implement it by using a VLSI(Very Large Scale Integrating) technology.

SUMMARY OF THE INVENTION

It is therefore, the primary object of the present invention is to provide a more efficient error locator polynomial calculating apparatus, for use in a Reed-Solomon("RS") decoder, which is implemented with a reduced number of GF multipliers and GF adders by using Recursive Berlekamp Algorithm("RBA").

In accordance with the present invention, there is provided an apparatus, for use in the RS decoder, for calculating an error locator polynomial $\sigma(X)$ by using the RBA, wherein $\sigma(X)$ is a (t)th order polynomial, t being a predetermined positive integer, the apparatus comprising:

a variable generator for determining cases to thereby update variables and providing a control signal CASE3_FLAG and a late discrepancy;

an inverse look up table for providing an inverse of the late discrepancy("inverse late discrepancy") from the variable generator;

a discrepancy calculation block for providing a discrepancy by using syndromes and an updated error locator polynomial, providing a control signal D_ZERO, delaying the updated error locator polynomial to thereby provide it, and providing a last updated error locator polynomial as a complete error locator polynomial;

a first GF multiplier for multiplying the discrepancy from the discrepancy calculation block by the inverse late discrepancy from the inverse look up table;

a selection block for selectively providing a constant or the updated error locator polynomial from the discrepancy calculation block or a feedback value;

a first shift register block for shifting an output from the selection block to thereby provide a shifted value and feed the shifted value back to the selection block;

a second GF multiplier for multiplying an output from the first GF multiplier with an output from the first shift register block;

a first GF adder for adding a multiplication result from the second GF multiplier with the updated error locator polynomial from the discrepancy calculation block to thereby feed an addition result back to the discrepancy calculation block; and, a first signal generator for generating control signals to thereby provide them to the selection block, the first shift register block, and the discrepancy calculation block.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 2:
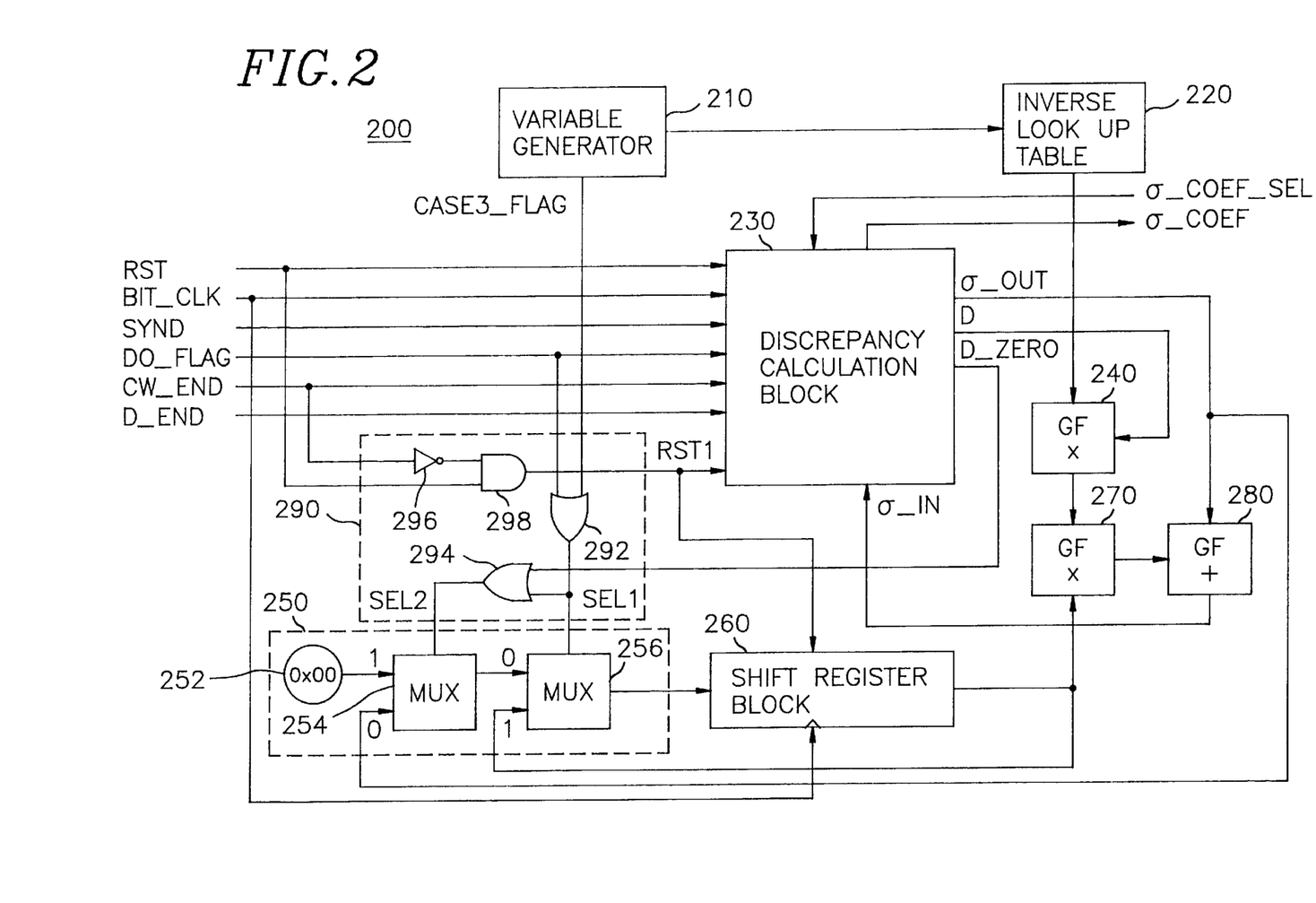
FIG. 2 describes a block diagram of an error locator polynomial by using Recursive Berlekamp Algorithm ("RBA") in accordance with an embodiment of the present invention.

Referring to FIG. 2, there is provided a block diagram of the error locator polynomial calculating apparatus 200 in accordance with a preferred embodiment of the present invention. Unlike the conventional apparatus 100, the error locator polynomial calculating apparatus 200, which is capable of determining t coefficients, does not include t cells. In the preferred embodiments shown in FIGS. 2, 3, 4 and 5, t is set to 8 for the purpose of simplicity.

Figure 4:
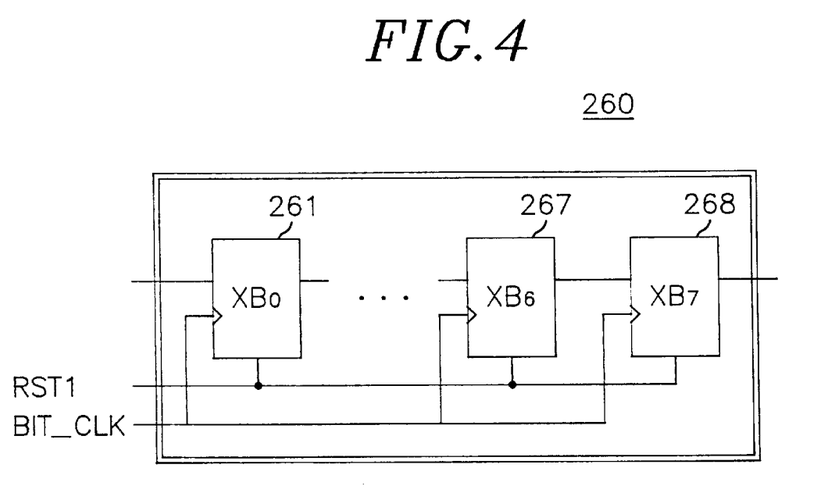
FIG. 4 is a detailed description of a first shift register block shown in FIG. 2; and, FIG. 5 is a minute depiction of a second shift register block shown in FIG. 3.

The error locator polynomial calculation apparatus 200 includes a variable generator 210 which updates variables, such as, the late discrepancy $b_N$, the number of iterations N, and the actual order of the error locator polynomial $L_N$, and provides a control signal CASE3_FLAG and the late discrepancy $b_N$; an inverse look up table 220 which provides an inverse of the late discrepancy("inverse late discrepancy") $b_N^{-1}$; a discrepancy calculation block 230 which calculates a discrepancy $D_N$, provides a control signal D_ZERO, delays an updated error locator polynomial σ_IN and provides a last updated error locator polynomial σ_OUT as a complete error locator polynomial; a first Galois Field ("GF") multiplier 240 which multiplies the inverse late discrepancy $b_N^{-1}$ by the discrepancy $D_N$ from the discrepancy calculation block 230; a selection block 250 which selectively provides a constant or, the updated error locator polynomial σ_OUT from the discrepancy calculation block 230 or, a feedback value; a first shift register block 260 which contains 8 serially connected registers, as shown is FIG. 4; a second GF multiplier 270 which multiplies an output from the first GF multiplier 240 with an output from the first shift register block 260; a first GF adder 280 which adds an output from the second GF multiplier 270 to the updated error locator polynomial σ_OUT from the discrepancy calculation block 230; and, a first signal generator 290 which provides control signals to the selection block 250, the first shift register block 260, and the discrepancy calculation block 230.

Figure 3:
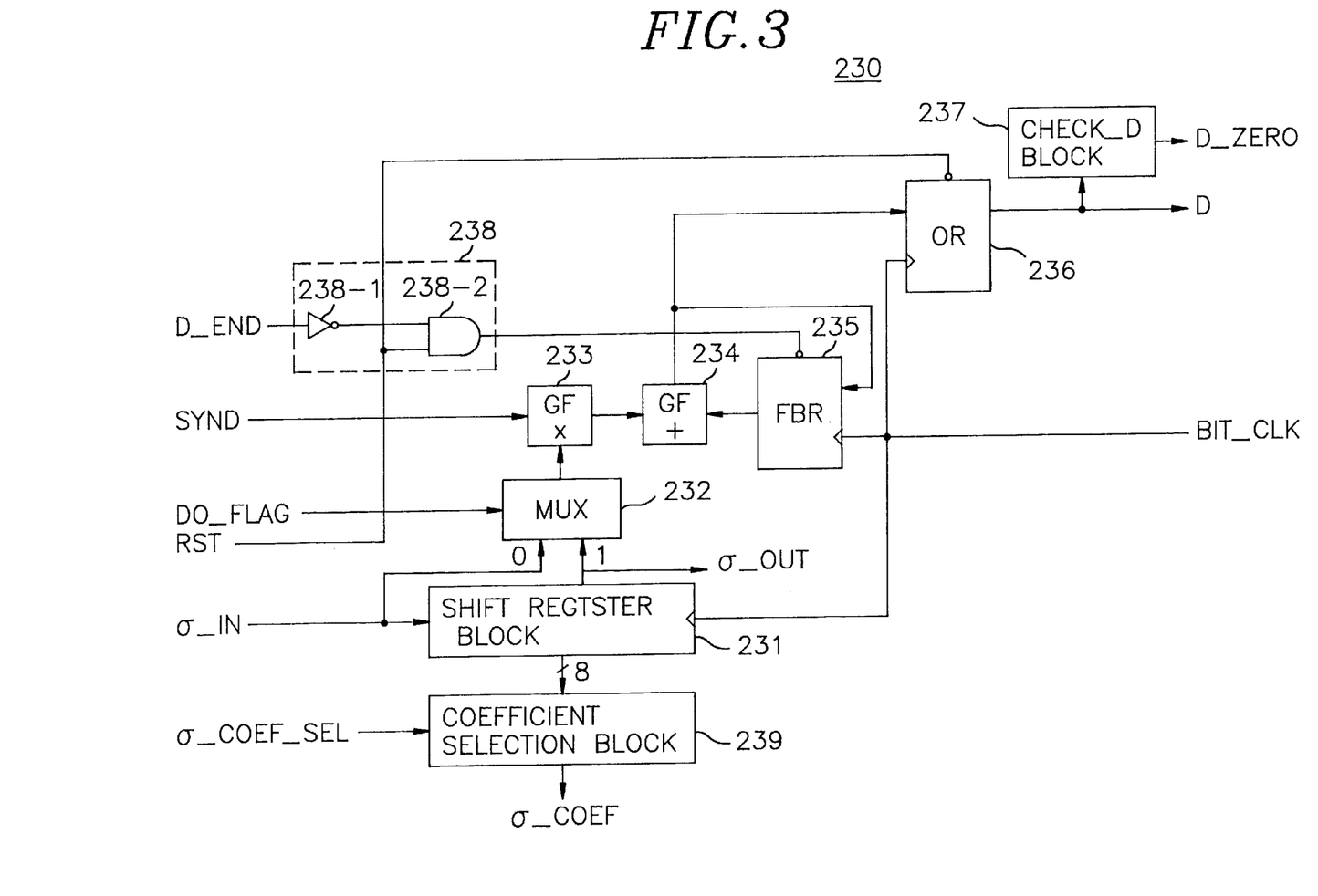
FIG. 3 presents a detailed block diagram of a discrepancy calculation block shown in FIG. 2.
Figure 5:
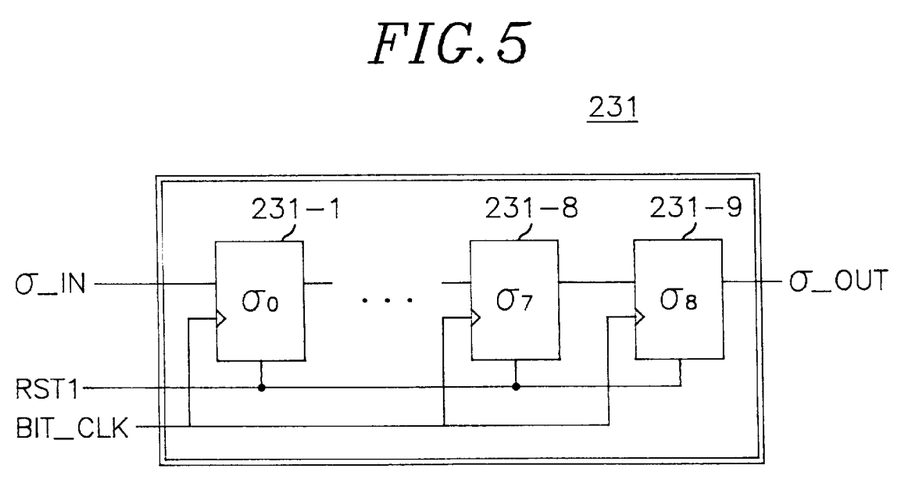

In addition, referring to FIG. 3, the discrepancy calculation block 230 contains a second shift register block 231 which has 9 serially connected registers, as shown in FIG.5, shifts the updated error locator polynomial σ_IN from the first GF adder 280, and provides a last updated error locator polynomial σ_OUT as a complete error locator polynomial; a third MUX 232 which selectively provides an output from the first GF adder 280 or an output from the second shift register block 231; a third GF multiplier 233 which multiplies an output from the third MUX 232 by a syndrome provided; a second GF adder 234 which adds an output from the third GF multiplier 233 with a feedback value; a feedback register("FBR") 235 which latches an output from the second GF adder 234 in response to a bit clock BIT_CLK and feeds the addition result back to the second GF adder 234; an output register("OR") 236 which latches an output from the second GF adder 234 and provides it as a discrepancy $D_N$; a check_D block 237 which provides the control signal D_ZERO as "high" if the discrepancy $D_N$ is "0"; a second signal generator 238 which provides control signals to the second shift register block 231 and the output register 236; and, a coefficient selection block 239.

The operation of the apparatus 200, shown in FIG. 2, will be explained in detail hereinafter.

Before the 0th iteration, registers $XB_0$, to $XB_7$ within the first shift register block 260, shown in FIG. 4, are initialized. That is, $XB_0$ is initialized with 1, and $XB_1$ to $XB_7$ are initialized with 0's. And, registers $\sigma_0$ to $\sigma_8$ within the second shift register block 231, shown in FIG. 5, are realized. That is, $\sigma_0$ is initialized with 1, and $\sigma_1$ to $\sigma_8$ are initialized with 0's.

TABLE 1

| N | BIT_CLK0 | BIT_CLK1 | BIT_CLK2 | BIT_CLK3 | BIT_CLK4 | BIT_CLK5 | BIT_CLK6 | BIT_CLK7 | BIT_CLK8 |
|---|---|---|---|---|---|---|---|---|---|
| 0 | $S_0$ | $S_0$ | $S_0$ | $S_0$ | $S_0$ | $S_0$ | $S_0$ | $S_0$ | $S_0$ |
| 1 | $S_0$ | $S_0$ | $S_0$ | $S_0$ | $S_0$ | $S_0$ | $S_0$ | $S_0$ | $S_1$ |
| 2 | $S_0$ | $S_0$ | $S_0$ | $S_0$ | $S_0$ | $S_0$ | $S_0$ | $S_1$ | $S_2$ |
| 3 | $S_0$ | $S_0$ | $S_0$ | $S_0$ | $S_0$ | $S_0$ | $S_1$ | $S_2$ | $S_3$ |
| 4 | $S_0$ | $S_0$ | $S_0$ | $S_0$ | $S_0$ | $S_1$ | $S_2$ | $S_3$ | $S_4$ |
| 5 | $S_0$ | $S_0$ | $S_0$ | $S_0$ | $S_1$ | $S_2$ | $S_3$ | $S_4$ | $S_5$ |
| 6 | $S_0$ | $S_0$ | $S_0$ | $S_1$ | $S_2$ | $S_3$ | $S_4$ | $S_5$ | $S_6$ |
| 7 | $S_0$ | $S_0$ | $S_1$ | $S_2$ | $S_3$ | $S_4$ | $S_5$ | $S_6$ | $S_7$ |
| 8 | $S_0$ | $S_1$ | $S_2$ | $S_3$ | $S_4$ | $S_5$ | $S_6$ | $S_7$ | $S_8$ |

TABLE 1-continued

| N | BIT_CLK0 | BIT_CLK1 | BIT_CLK2 | BIT_CLK3 | BIT_CLK4 | BIT_CLK5 | BIT_CLK6 | BIT_CLK7 | BIT_CLK8 |
|---|---|---|---|---|---|---|---|---|---|
| 9  | $S_1$ | $S_2$ | $S_3$ | $S_4$ | $S_5$ | $S_6$ | $S_7$ | $S_8$ | $S_9$ |
| 10 | $S_2$ | $S_3$ | $S_4$ | $S_5$ | $S_6$ | $S_7$ | $S_8$ | $S_9$ | $S_{10}$ |
| 11 | $S_3$ | $S_4$ | $S_5$ | $S_6$ | $S_7$ | $S_8$ | $S_9$ | $S_{10}$ | $S_{11}$ |
| 12 | $S_4$ | $S_5$ | $S_6$ | $S_7$ | $S_8$ | $S_9$ | $S_{10}$ | $S_{11}$ | $S_{12}$ |
| 13 | $S_5$ | $S_6$ | $S_7$ | $S_8$ | $S_9$ | $S_{10}$ | $S_{11}$ | $S_{12}$ | $S_{13}$ |
| 14 | $S_6$ | $S_7$ | $S_8$ | $S_9$ | $S_{10}$ | $S_{11}$ | $S_{12}$ | $S_{13}$ | $S_{14}$ |
| 15 | $S_7$ | $S_8$ | $S_9$ | $S_{10}$ | $S_{11}$ | $S_{12}$ | $S_{13}$ | $S_{14}$ | $S_{15}$ | referring back to FIG. 3, the syndromes are sequentially providing the discrepancy calculation block 230, in the order given in Table 1, to thereby be used for calculating $D_N$. Each of the iterations is performed in response to 9 BIT_CLK's, and, each of the operations is executed in response to BIT_CLK.

A control signal D0_FLAG is "high" for the 0th iteration so that the third MUX 232 selects an output from the second shift register block 231 to thereby provide it to the third GF multiplier 233. And for all the iterations except the 0th iteration, the D0_FLAG is "low" so that the third MUX 232 selects the updated error locator polynomial σ_IN from the first GF adder 280.

At the third GF multiplier 233, the provided syndrome is multiplied by an output from the third MUX 232. Then, the multiplication result is provided to the second GF adder 234.

At the second GF adder 234, an output from the third GF multiplier 233 is added with an output from the feedback register 235. And an addition result is provided to the feedback register 235 and the output register 236.

The feedback register 235 latches an output from the second GF adder 234 in response to the BIT_CLK, and feeds it back to the second GF adder 234.

A control signal D_END becomes "high" at the BIT_CLK8 of every iteration, to thereby enable the output register 236. The output register 236 latches an output from the second GF adder 234, and provides it as a discrepancy $D_N$ to the first GF multiplier 240 in response to the control signal D_END. The check_D block 237 checks the discrepancy $D_N$ from the output register 236. And if $D_N$ is "0", the check_D block 237 provides the control signal D_ZERO as "high" to the variable generator 210 and the first signal generator 290.

Referring back to FIG. 2, $D_N$ from the discrepancy calculation block 230 is provided to the first GF multiplier 240. Within the first signal generator 290, a first OR gate 292 logically adds the CASE3_FLAG from the variable generator 210 to the D0_FLAG to thereby provide a selection signal SEL1. And a second OR gate 294 logically adds the SEL1 from the first OR gate 292 to the control signal D_ZERO to thereby provide a selection signal SEL2 to the selection block 250.

Within the selection block 250, a first MUX 254 selects a constant from a ROM 252 on an input port 1 if the SEL2 provided from the second OR gate 294 in the first signal genertor 290 is "high", and selects the σ_OUT from the discrepancy calculation block 230 on an input port 0 if the SEL2 is "low". A second MUX 256 selects an output from the first MUX 254 on an input port 0 if the SEL1 from the first OR gate 292 in the first signal generator 290 is "low", and selects the feedback value from the first shift register block 260 on an input port 1 if the SEL1 is "high".

The first shift register block 260 shifts an output from the second MUX 256 in response to the BIT_CLK, to thereby feed it back to the second MUX 256 and provide it to the second GF multiplier 270.

Meanwhile, at the variable generator 210, $b_N$, N, $L_N$ are updated based on the value of the discrepancy $D_N$, and three different cases, case 1 to 3, are determined, and then a corresponding control signal CASE3_FLAG and the late discrepancy $b_N$ are provided.

If the discrepancy $D_N$ is "0", it corresponds to the case 1, and then the CASE3_FLAG is "low" and the D_ZERO is "high". If the discrepancy $D_N$ is not "0" and the $2L_N$ is smaller than or equal to the N, it corresponds to the case 2, and then the CASE3_FLAG is "low" and the D_ZERO is "low". If the discrepancy $D_N$ is not "0" and the $2L_N$ is larger than the N, it corresponds to the case 3, and then the CASE3_FLAG is "high" and the D_ZERO is "low".

The inverse look up table 220 calculates the inverse of the late discrepancy $b_N^{-1}$ to thereby provide it to the first GF multiplier 240. At the first GF multiplier 240, the discrepancy $D_N$ provided is multiplied by the inverse late discrepancy $b_N^{-1}$.

The second GF multiplier 270 multiplies an output from the first GF multiplier 240 by an output from the first shift register block 260, to thereby provide a multiplication result to the first GF adder 280.

At the first GF adder 280, an output from the second GF multiplier 270 is added to an output from the second shift register block 231, i.e., the updated error locator polynomial σ—OUT. Then, an addition result from the first GF adder 280 is fed back to the discrepancy calculation block 230.

In comparison with the Recursive Berlekamp Algorithm, the present invention operates as follows:

In case 1, the CASE3_FLAG is "low", the D0_FLAG is "low", and the D_ZERO is "high". Thus the SEL2 is "high" and the SEL1 is "low", to thereby make the first MUX 254 select the constant on the input port 1 and the second MUX 256 select the constant on the input port 0. The constant "0" is provided to the first shift register block 260, that is, the contents of the XBi's are shifted right and the content of the register XB0 becomes "0".

In case 2, the CASE3_FLAG is "low", the D0_FLAG is "low", and the D_ZERO is "low". Thus the SEL2 is "low" and the SEL1 is "low", to thereby make the first MUX 254 select the σ_OUT on the port 0 and the second MUX 256 select the σ_OUT on the port 0. The updated error locator polynomial σ_OUT is provided to the first shift register block 260, and, all of σ(X), XB(X), $L_N$ and $b_N$ are updated.

In case 3, the CASE3_FLAG is "high", the D0_FLAG is "low", and the D_ZERO is "low". Thus the SEL2 is "high" and the SEL1 is "high", to thereby make the first MUX 254 select the constant on the port 1 and the second MUX 256 select the feedback value provided from the first shift register block 260 on the port 1. The feedback value is fed back to the first shift register block 260, that is, the contents of the XBi's are shifted right, and the content of the XB7 is fed to the XB0.

Within the first signal generator 290, a first inverter 296 inverts a codeword end signal CW_END and provides it to a first AND gate 298. And a reset signal RST is provided to the first AND gate 298. Then, an output from the first AND gate 298, i.e., RST1 is provided to the first shift register block 260 and the second shift register block 231 as a reset signal.

The registers within the first shift register block 260 and the second shift register block 231 are reset, when the CW_END is "high" or the RST is "low". In other words, the registers are reset if codewords end regardless of the value of the RST, or if the reset signal is made regardless of the value of the CW_END.

Within the second signal generator 238, a second inverter 238-1 inverts a discrepancy end signal D_END and provides it to a second AND gate 238-2. And the RST is provided to the second AND gate 238-2, and the output register 236. Then, an output from the second AND gate 238-2 is provided to the feedback register 235.

When the RST is "low" or the D_END is "high", the feedback register 235 is reset, and, when the RST is "low", the output register 236 is reset. In other words, the feedback register 235 is reset if each of the iterations ends regardless of the value of the RST, or if the reset signal is made regardless of the value of the D_END. And the output register 236 is reset if the reset signal is made.

Tables 2–7 show the contents of the first shift register block 260 and the second register block 231 for each case, as follows:

TABLE 2

(case 1)

| register | $XB_0$ | $XB_1$ | $XB_2$ | $XB_3$ | $XB_4$ | $XB_5$ | $XB_6$ | $XB_7$ |
|---|---|---|---|---|---|---|---|---|
| PRE_STAT | $B_0$ | $B_1$ | $B_2$ | $B_3$ | $B_4$ | $B_5$ | $B_6$ | $B_7$ |
| BIT_CLK0 | $B_7$ | $B_0$ | $B_1$ | $B_2$ | $B_3$ | $B_4$ | $B_5$ | $B_6$ |
| BIT_CLK1 | $B_6$ | $B_7$ | $B_0$ | $B_1$ | $B_2$ | $B_3$ | $B_4$ | $B_5$ |
| BIT_CLK2 | $B_5$ | $B_6$ | $B_7$ | $B_0$ | $B_1$ | $B_2$ | $B_3$ | $B_4$ |
| BIT_CLK3 | $B_4$ | $B_5$ | $B_6$ | $B_7$ | $B_0$ | $B_1$ | $B_2$ | $B_3$ |
| BIT_CLK4 | $B_3$ | $B_4$ | $B_5$ | $B_6$ | $B_7$ | $B_0$ | $B_1$ | $B_2$ |
| BIT_CLK5 | $B_2$ | $B_3$ | $B_4$ | $B_5$ | $B_6$ | $B_7$ | $B_0$ | $B_1$ |
| BIT_CLK6 | $B_1$ | $B_2$ | $B_3$ | $B_4$ | $B_5$ | $B_6$ | $B_7$ | $B_0$ |
| BIT_CLK7 | $B_0$ | $B_1$ | $B_2$ | $B_3$ | $B_4$ | $B_5$ | $B_6$ | $B_7$ |
| BIT_CLK8 | 0 | $B_0$ | $B_1$ | $B_2$ | $B_3$ | $B_4$ | $B_5$ | $B_6$ |

TABLE 3

(case 2)

| register | $XB_0$ | $XB_1$ | $XB_2$ | $XB_3$ | $XB_4$ | $XB_5$ | $XB_6$ | $XB_7$ |
|---|---|---|---|---|---|---|---|---|
| PRE_STAT | $B_0$ | $B_1$ | $B_2$ | $B_3$ | $B_4$ | $B_5$ | $B_6$ | $B_7$ |
| BIT_CLK0 | $C_8$ | $B_0$ | $B_1$ | $B_2$ | $B_3$ | $B_4$ | B5 | B6 |
| BIT_CLK1 | $C_7$ | $C_8$ | $B_0$ | $B_1$ | $B_2$ | $B_3$ | B4 | B5 |
| BIT_CLK2 | $C_6$ | $C_7$ | $C_8$ | $B_0$ | $B_1$ | $B_2$ | B3 | B4 |
| BIT_CLK3 | $C_5$ | $C_6$ | $C_7$ | $C_8$ | $B_0$ | $B_1$ | B2 | B3 |
| BIT_CLK4 | $C_4$ | $C_5$ | $C_6$ | $C_7$ | $C_8$ | $B_0$ | B1 | B2 |
| BIT_CLK5 | $C_3$ | $C_4$ | $C_5$ | $C_6$ | $C_7$ | $C_8$ | B0 | B1 |
| BIT_CLK6 | $C_2$ | $C_3$ | $C_4$ | $C_5$ | $C_6$ | $C_7$ | C8 | B0 |
| BIT_CLK7 | $C_1$ | $C_2$ | $C_3$ | $C_4$ | $C_5$ | $C_6$ | C7 | C8 |
| BIT_CLK8 | $C_0$ | $C_1$ | $C_2$ | $C_3$ | $C_4$ | $C_5$ | $C_6$ | $C_7$ |

TABLE 4

(case 3)

| register | $XB_0$ | $XB_1$ | $XB_2$ | $XB_3$ | $XB_4$ | $XB_5$ | $XB_6$ | $XB_7$ |
|---|---|---|---|---|---|---|---|---|
| PRE_STAT | $B_0$ | $B_1$ | $B_2$ | $B_3$ | $B_4$ | $B_5$ | $B_6$ | $B_7$ |
| BIT_CLK0 | $B_7$ | $B_0$ | $B_1$ | $B_2$ | $B_3$ | $B_4$ | $B_5$ | $B_6$ |
| BIT_CLK1 | $B_6$ | $B_7$ | $B_0$ | $B_1$ | $B_2$ | $B_3$ | $B_4$ | $B_5$ |
| BIT_CLK2 | $B_5$ | $B_6$ | $B_7$ | $B_0$ | $B_1$ | $B_2$ | $B_3$ | $B_4$ |
| BIT_CLK3 | $B_4$ | $B_5$ | $B_6$ | $B_7$ | $B_0$ | $B_1$ | $B_2$ | $B_3$ |
| BIT_CLK4 | $B_3$ | $B_4$ | $B_5$ | $B_6$ | $B_7$ | $B_0$ | $B_1$ | $B_2$ |
| BIT_CLK5 | $B_2$ | $B_3$ | $B_4$ | $B_5$ | $B_6$ | $B_7$ | $B_0$ | $B_1$ |
| BIT_CLK6 | $B_1$ | $B_2$ | $B_3$ | $B_4$ | $B_5$ | $B_6$ | $B_7$ | $B_0$ |
| BIT_CLK7 | $B_0$ | $B_1$ | $B_2$ | $B_3$ | $B_4$ | $B_5$ | $B_6$ | $B_7$ |
| BIT_CLK8 | 0 | $B_0$ | $B_1$ | $B_2$ | $B_3$ | $B_4$ | $B_5$ | $B_6$ |

TABLE 5

(case 1)

| | $\sigma_0$ | $\sigma_1$ | $\sigma_2$ | $\sigma_3$ | $\sigma_4$ | $\sigma_5$ | $\sigma_6$ | $\sigma_7$ | $\sigma_8$ |
|---|---|---|---|---|---|---|---|---|---|
| PRE_STAT | $C_0$ | $C_1$ | $C_2$ | $C_3$ | $C_4$ | $C_5$ | $C_6$ | $C_7$ | $C_8$ |
| BIT_CLK0 | $C_8$ | $C_0$ | $C_1$ | $C_2$ | $C_3$ | $C_4$ | $C_5$ | $C_6$ | $C_7$ |
| BIT_CLK1 | $C_7$ | $C_8$ | $C_0$ | $C_1$ | $C_2$ | $C_3$ | $C_4$ | $C_5$ | $C_6$ |
| BIT_CLK2 | $C_6$ | $C_7$ | $C_8$ | $C_0$ | $C_1$ | $C_2$ | $C_3$ | $C_4$ | $C_5$ |
| BIT_CLK3 | $C_5$ | $C_6$ | $C_7$ | $C_8$ | $C_0$ | $C_1$ | $C_2$ | $C_3$ | $C_4$ |
| BIT_CLK4 | $C_4$ | $C_5$ | $C_6$ | $C_7$ | $C_8$ | $C_0$ | $C_1$ | $C_2$ | $C_3$ |
| BIT_CLK5 | $C_3$ | $C_4$ | $C_5$ | $C_6$ | $C_7$ | $C_8$ | $C_0$ | $C_1$ | $C_2$ |
| BIT_CLK6 | $C_2$ | $C_3$ | $C_4$ | $C_5$ | $C_6$ | $C_7$ | $C_8$ | $C_0$ | $C_1$ |
| BIT_CLK7 | $C_1$ | $C_2$ | $C_3$ | $C_4$ | $C_5$ | $C_6$ | $C_7$ | $C_8$ | $C_0$ |
| BIT_CLK8 | $C_0$ | $C_1$ | $C_2$ | $C_3$ | $C_4$ | $C_5$ | $C_6$ | $C_7$ | $C_8$ |

TABLE 6

(case 2)

| register | $\sigma_0$ | $\sigma_1$ | $\sigma_2$ | $\sigma_3$ | $\sigma_4$ | $\sigma_5$ | $\sigma_6$ | $\sigma_7$ | $\sigma_8$ |
|---|---|---|---|---|---|---|---|---|---|
| PRE_STAT | $C_0$ | $C_1$ | $C_2$ | $C_3$ | $C_4$ | $C_5$ | $C_6$ | $C_7$ | $C_8$ |
| BIT_CLK0 | $C_8 \cdot D \cdot b^{-1} \cdot B_7$ | $C_0$ | $C_1$ | $C_2$ | $C_3$ | $C_4$ | $C_5$ | $C_6$ | $C_7$ |
| BIT_CLK1 | $C_7 \cdot D \cdot b^{-1} \cdot B_6$ | $C_8 \cdot D \cdot b^{-1} \cdot B_7$ | $C_0$ | $C_1$ | $C_2$ | $C_3$ | $C_4$ | $C_5$ | $C_6$ |
| BIT_CLK2 | $C_6 \cdot D \cdot b^{-1} \cdot B_5$ | $C_7 \cdot D \cdot b^{-1} \cdot B_6$ | $C_8 \cdot D \cdot b^{-1} \cdot B_7$ | $C_0$ | $C_1$ | $C_2$ | $C_3$ | $C_4$ | $C_5$ |
| BIT_CLK3 | $C_5 \cdot D \cdot b^{-1} \cdot B_4$ | $C_6 \cdot D \cdot b^{-1} \cdot B_5$ | $C_7 \cdot D \cdot b^{-1} \cdot B_6$ | $C_8 \cdot D \cdot b^{-1} \cdot B_7$ | $C_0$ | $C_1$ | $C_2$ | $C_3$ | $C_4$ |
| BIT_CLK4 | $C_4 \cdot D \cdot b^{-1} \cdot B_3$ | $C_5 \cdot D \cdot b^{-1} \cdot B_4$ | $C_6 \cdot D \cdot b^{-1} \cdot B_5$ | $C_7 \cdot D \cdot b^{-1} \cdot B_6$ | $C_8 \cdot D \cdot b^{-1} \cdot B_7$ | $C_0$ | $C_1$ | $C_2$ | $C_3$ |
| BIT_CLK5 | $C_3 \cdot D \cdot b^{-1} \cdot B_2$ | $C_4 \cdot D \cdot b^{-1} \cdot B_3$ | $C_5 \cdot D \cdot b^{-1} \cdot B_4$ | $C_6 \cdot D \cdot b^{-1} \cdot B_5$ | $C_7 \cdot D \cdot b^{-1} \cdot B_6$ | $C_8 \cdot D \cdot b^{-1} \cdot B_7$ | $C_0$ | $C_1$ | $C_2$ |

TABLE 6-continued (case 2)

| register | $\sigma_0$ | $\sigma_1$ | $\sigma_2$ | $\sigma_3$ | $\sigma_4$ | $\sigma_5$ | $\sigma_6$ | $\sigma_7$ | $\sigma_8$ |
|---|---|---|---|---|---|---|---|---|---|
| BIT_CLK6 | $C_2 \cdot D \cdot b^{-1} \cdot B_1$ | $C_3 \cdot D \cdot b^{-1} \cdot B_2$ | $C_4 \cdot D \cdot b^{-1} \cdot B_3$ | $C_5 \cdot D \cdot b^{-1} \cdot B_4$ | $C_6 \cdot D \cdot b^{-1} \cdot B_5$ | $C_7 \cdot D \cdot b^{-1} \cdot B_6$ | $C_8 \cdot D \cdot b^{-1} \cdot B_7$ | $C_0$ | $C_1$ |
| BIT_CLK7 | $C_1 \cdot D \cdot b^{-1} \cdot B_0$ | $C_2 \cdot D \cdot b^{-1} \cdot B_1$ | $C_3 \cdot D \cdot b^{-1} \cdot B_2$ | $C_4 \cdot D \cdot b^{-1} \cdot B_3$ | $C_5 \cdot D \cdot b^{-1} \cdot B_4$ | $C_6 \cdot D \cdot b^{-1} \cdot B_5$ | $C_7 \cdot D \cdot b^{-1} \cdot B_6$ | $C_8 \cdot D \cdot b^{-1} \cdot B_7$ | $C_0$ |
| BIT_CLK8 | $C_0$ | $C_1 \cdot D \cdot b^{-1} \cdot B_0$ | $C_2 \cdot D \cdot b^{-1} \cdot B_1$ | $C_3 \cdot D \cdot b^{-1} \cdot B_2$ | $C_4 \cdot D \cdot b^{-1} \cdot B_3$ | $C_5 \cdot D \cdot b^{-1} \cdot B_4$ | $C_6 \cdot D \cdot b^{-1} \cdot B_5$ | $C_7 \cdot D \cdot b^{-1} \cdot B_6$ | $C_7 \cdot D \cdot b^{-1} \cdot B_6$ |

TABLE 7

(case 3)

| register | $\sigma_0$ | $\sigma_1$ | $\sigma_2$ | $\sigma_3$ | $\sigma_4$ | $\sigma_5$ | $\sigma_6$ | $\sigma_7$ | $\sigma_8$ |
|---|---|---|---|---|---|---|---|---|---|
| PRE_STAT | $C_0$ | $C_1$ | $C_2$ | $C_3$ | $C_4$ | $C_5$ | $C_6$ | $C_7$ | $C_8$ |
| BIT_CLK0 | $C_8 \cdot D \cdot b^{-1} \cdot B_7$ | $C_0$ | $C_1$ | $C_2$ | $C_3$ | $C_4$ | $C_5$ | $C_6$ | $C_7$ |
| BIT_CLK1 | $C_7 \cdot D \cdot b^{-1} \cdot B_6$ | $C_8 \cdot D \cdot b^{-1} \cdot B_7$ | $C_0$ | $C_1$ | $C_2$ | $C_3$ | $C_4$ | $C_5$ | $C_6$ |
| BIT_CLK2 | $C_6 \cdot D \cdot b^{-1} \cdot B_5$ | $C_7 \cdot D \cdot b^{-1} \cdot B_6$ | $C_8 \cdot D \cdot b^{-1} \cdot B_7$ | $C_0$ | $C_1$ | $C_2$ | $C_3$ | $C_4$ | $C_5$ |
| BIT_CLK3 | $C_5 \cdot D \cdot b^{-1} \cdot B_4$ | $C_6 \cdot D \cdot b^{-1} \cdot B_5$ | $C_7 \cdot D \cdot b^{-1} \cdot B_6$ | $C_8 \cdot D \cdot b^{-1} \cdot B_7$ | $C_0$ | $C_1$ | $C_2$ | $C_3$ | $C_4$ |
| BIT_CLK4 | $C_4 \cdot D \cdot b^{-1} \cdot B_3$ | $C_5 \cdot D \cdot b^{-1} \cdot B_4$ | $C_6 \cdot D \cdot b^{-1} \cdot B_5$ | $C_7 \cdot D \cdot b^{-1} \cdot B_6$ | $C_8 \cdot D \cdot b^{-1} \cdot B_7$ | $C_0$ | $C_1$ | $C_2$ | $C_3$ |
| BIT_CLK5 | $C_3 \cdot D \cdot b^{-1} \cdot B_2$ | $C_4 \cdot D \cdot b^{-1} \cdot B_3$ | $C_5 \cdot D \cdot b^{-1} \cdot B_4$ | $C_6 \cdot D \cdot b^{-1} \cdot B_5$ | $C_7 \cdot D \cdot b^{-1} \cdot B_6$ | $C_8 \cdot D \cdot b^{-1} \cdot B_7$ | $C_0$ | $C_1$ | $C_2$ |
| BIT_CLK6 | $C_2 \cdot D \cdot b^{-1} \cdot B_1$ | $C_3 \cdot D \cdot b^{-1} \cdot B_2$ | $C_4 \cdot D \cdot b^{-1} \cdot B_3$ | $C_5 \cdot D \cdot b^{-1} \cdot B_4$ | $C_6 \cdot D \cdot b^{-1} \cdot B_5$ | $C_7 \cdot D \cdot b^{-1} \cdot B_6$ | $C_8 \cdot D \cdot b^{-1} \cdot B_7$ | $C_0$ | $C_1$ |
| BIT_CLK7 | $C_1 \cdot D \cdot b^{-1} \cdot B_0$ | $C_2 \cdot D \cdot b^{-1} \cdot B_1$ | $C_3 \cdot D \cdot b^{-1} \cdot B_2$ | $C_4 \cdot D \cdot b^{-1} \cdot B_3$ | $C_5 \cdot D \cdot b^{-1} \cdot B_4$ | $C_6 \cdot D \cdot b^{-1} \cdot B_5$ | $C_7 \cdot D \cdot b^{-1} \cdot B_6$ | $C_8 \cdot D \cdot b^{-1} \cdot B_7$ | $C_0$ |
| BIT_CLK8 | $C_0$ | $C_1 \cdot D \cdot b^{-1} \cdot B_0$ | $C_2 \cdot D \cdot b^{-1} \cdot B_1$ | $C_3 \cdot D \cdot b^{-1} \cdot B_2$ | $C_4 \cdot D \cdot b^{-1} \cdot B_3$ | $C_5 \cdot D \cdot b^{-1} \cdot B_4$ | $C_6 \cdot D \cdot b^{-1} \cdot B_5$ | $C_7 \cdot D \cdot b^{-1} \cdot B_6$ | $C_7 \cdot D \cdot b^{-1} \cdot B_6$ |

In this way, the apparatus of the error locator polynomial calculating apparatus 200 executes the operation until N becomes 15, and provides the complete error locator polynomial σ(X).

For the sake of economy, the detailed illustration for the variable generator 210 and the inverse look up table 220, shown in FIG. 2, and the coefficient selection block 239, shown in FIG. 3, is omitted. The role of the variable generator 210 and the inverse look up table 220 is explained above. And the role of the coefficient selection block 239 is selectively providing a coefficient to an omega calculation block(not shown) to calculate an error evaluator polynomial Ω(X), in response to a control signal σ_COEF_SEL. For those skilled in the art, however, the detailed structure and the role of the variable generator 210, the inverse look up table 220, and the coefficient selection block 239 are obvious.

Although the operation of the apparatus of the present invention is illustrated for the specified number of errors, e.g., t=8, other number of errors other than the one used herein can be utilized to calculate the coefficients of the error locator polynomial σ(X).

While the present invention has been described with respect to the particular embodiments, it will be apparent to those skilled in the art that various changes and modifications may be made without departing from the spirit and scope of the invention as defined in the following claims.

What is claimed is:

1. An apparatus, for use in a Reed-Solomon decoder, for calculating an error locator polynomial σ(X) by using Recursive Berlekamp Algorithm, wherein σ(X) is a (t)th order polynomial, and t being a predetermined positive integer, said apparatus comprising:

a variable generator for determining cases to thereby update variables, and providing a control signal CASE3_FLAG and a late discrepancy, wherein said variables are the late discrepancy, the number of iterations, and an actual order of the error locator polynomial;

an inverse look up table for providing an inverse of the late discrepancy("inverse late discrepancy") from the variable generator;

a discrepancy calculation block for providing a discrepancy by using syndromes and an updated error locator polynomial, providing a control signal D_ZERO, delaying the updated error locator polynomial to thereby provide it, and providing a last updated error locator polynomial as a complete error locator polynomial;

a first GF multiplier for multiplying the discrepancy from the discrepancy calculation block by the inverse late discrepancy from the inverse look up table;

a selection block for selectively providing a constant or the updated error locator polynomial from the discrepancy calculation block or a feedback value;

a first shift register block for shifting an output from the selection block to thereby provide a shifted value and feed the shifted value back to the selection block;

a second GF multiplier for multiplying an output from the first GF multiplier by an output from the first shift register block;

a first GF adder for adding a multiplication result from the second GF multiplier to the updated error locator polynomial from the discrepancy calculation block to thereby feed an addition result back to the discrepancy calculation block; and, a first signal generator for generating control signals to thereby provide them to the selection block, the first shift register block, and the discrepancy calculation block.

2. The apparatus of claim 1, wherein said first signal generator includes:

a first OR gate for logically adding the CASE3_FLAG to a control signal D0_FLAG to thereby provide a selection signal SEL1;

a second OR gate for logically adding the D_ZERO to the output from the first OR gate to thereby provide a selection signal SEL2;

a first inverter for inverting a code word end signal CW_END; and, a first AND gate for logically multiplying the inverted CW_END from the first inverter by a reset signal RST to thereby provide a reset signal RST1 to the first shift register block and the discrepancy calculation block.

3. The apparatus of claim 1, wherein said selection block includes:

a ROM for storing a constant;

a first MUX for providing said constant from the ROM if the SEL2 from the second OR gate is "high" and providing the updated error locator polynomial from the discrepancy calculation block if the SEL2 is "low";

a second MUX for providing an output from the first MUX if the SEL1 from the first OR gate is "low" and providing the feedback value from the first shift register block if the SEL1 is "high".

4. The apparatus of claim 3, wherein said constant is "0".

5. The apparatus of claim 1, wherein said first shift register block includes t serially connected registers to thereby shift an output from the selection block and provide it.

6. The apparatus of claim 1, wherein said discrepancy calculation block includes:

a second shift register block for shifting the updated error locator polynomial from the first GF adder, and providing a last updated error locator polynomial as a complete error locator polynomial;

a third MUX for selectively providing an output from the first GF adder or a shifted error locator polynomial from the second shift register block;

a third GF multiplier for multiplying an output from the third MUX by syndrome;

an second GF adder for adding an output from the third GF multiplier to an feedback value;

a feedback register for latching an output from the second GF adder in response to a bit clock BIT_CLK and feeding it back to the second GF adder;

an output register for latching an output from the second GF adder and providing it as a discrepancy;

a check_D block for providing the control signal D_ZERO;

a second signal generator for providing control signals to the output register and the second shift register block and, a coefficient selection block 239 for selectively providing outputs of the second shift register block as a coefficient of the updated error locator polynomial.

7. The apparatus of claim 6, wherein said second signal generator has:

a second inverter for inverting a discrepancy end signal D_END provided; and, a second AND gate for logically multiplying the inverted D_END from the second inverter by the RST to thereby provide an output to the feedback register.

8. The apparatus of claim 6, wherein said second shift register block has (t+1) serially connected registers to thereby shift an output from the first GF adder to thereby provide it.

* * * * *

UNITED STATES PATENT AND TRADEMARK OFFICE
CERTIFICATE OF CORRECTION

PATENT NO. : 5,878,058
DATED : March 2, 1999
INVENTOR(S) : Yong-Hee Im

It is certified that error appears in the above-identified patent and that said Letters Patent is hereby corrected as shown below:

On the title page, item [30], should read

Foreign Application Priority Data

May 14, 1996  [KR]  Rep. of Korea    96-16009

Signed and Sealed this

Sixth Day of July, 1999

Attest:

Q. TODD DICKINSON

Attesting Officer

Acting Commissioner of Patents and Trademarks